(12) United States Patent
Lo et al.

(10) Patent No.: US 10,969,825 B2
(45) Date of Patent: Apr. 6, 2021

(54) MAGNETIC MEMBERS OF DOCKING DEVICES

(71) Applicant: Hewlett-Packard Development Company, L.P., Spring, TX (US)

(72) Inventors: Jose Ticy Lo, Houston, TX (US); Chan-Woo Park, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/606,903

(22) PCT Filed: Jun. 22, 2017

(86) PCT No.: PCT/US2017/038663
§ 371 (c)(1),
(2) Date: Oct. 21, 2019

(87) PCT Pub. No.: WO2018/236376
PCT Pub. Date: Dec. 27, 2018

(65) Prior Publication Data
US 2020/0379513 A1    Dec. 3, 2020

(51) Int. Cl.
*G06F 1/16*     (2006.01)
*H05K 5/02*     (2006.01)
*H01F 7/06*     (2006.01)

(52) U.S. Cl.
CPC ............ *G06F 1/1632* (2013.01); *H01F 7/06* (2013.01); *H05K 5/0221* (2013.01); *H05K 5/0234* (2013.01)

(58) Field of Classification Search
CPC combination set(s) only.
See application file for complete search history.

(56) References Cited

U.S. PATENT DOCUMENTS

| | | | |
|---|---|---|---|
| 4,380,162 A | 4/1983 | Woolfson | |
| 5,923,528 A * | 7/1999 | Lee | F16M 11/105 248/291.1 |
| 6,081,420 A * | 6/2000 | Kim | G06F 1/16 361/679.22 |
| 6,510,049 B2 * | 1/2003 | Rosen | F16M 11/105 248/919 |
| 7,338,019 B2 | 3/2008 | Liu et al. | |

(Continued)

FOREIGN PATENT DOCUMENTS

CN     104712194     6/2015

OTHER PUBLICATIONS

Piltch, A., "Meet the Smart Magnets That Hold Your 2-in-1 Together", Jan. 13, 2016.

*Primary Examiner* — Lisa Lea-Edmonds
(74) *Attorney, Agent, or Firm* — HP, Inc. Patent Department

(57) ABSTRACT

Examples disclosed herein provide a docking device for a computing device. One example docking device includes a mounting device to align with a mating cavity of the computing device. The docking device includes a locking blade that extends from the mounting device into a slot in the mating cavity of the computing device. The mounting device includes a first magnetic member disposed within the mounting device to initiate extension and retraction of the locking blade from the mounting device into and out of the slot in the mating cavity.

15 Claims, 5 Drawing Sheets

(56) References Cited

U.S. PATENT DOCUMENTS

| | | | | |
|---|---|---|---|---|
| 7,349,206 B2* | 3/2008 | Lin | ............... | G06F 1/1632 |
| | | | | 361/679.41 |
| 7,499,272 B2* | 3/2009 | Searby | ............... | F16M 11/041 |
| | | | | 248/917 |
| 7,502,225 B2* | 3/2009 | Solomon | ............... | G06F 1/1632 |
| | | | | 361/679.41 |
| 7,502,226 B2* | 3/2009 | Searby | ............... | F16M 11/041 |
| | | | | 361/679.41 |
| 7,505,254 B2* | 3/2009 | Sheng | ............... | G06F 1/18 |
| | | | | 361/679.07 |
| 7,515,408 B2* | 4/2009 | Bakker | ............... | G06F 1/1632 |
| | | | | 361/679.55 |
| 7,589,959 B2* | 9/2009 | Ikeda | ............... | G06F 1/1601 |
| | | | | 361/679.21 |
| 7,679,892 B2* | 3/2010 | Jung | ............... | F16M 11/10 |
| | | | | 361/679.21 |
| 7,787,239 B2* | 8/2010 | Mangaroo | ............... | G06K 7/0004 |
| | | | | 361/679.01 |
| 7,848,090 B2* | 12/2010 | Ikeda | ............... | G06F 3/02 |
| | | | | 361/679.21 |
| 8,234,509 B2* | 7/2012 | Gioscia | ............... | G06F 1/26 |
| | | | | 713/300 |
| 8,385,822 B2* | 2/2013 | Chatterjee | ............... | G06F 1/1632 |
| | | | | 455/41.1 |
| 8,411,426 B2* | 4/2013 | Ikeda | ............... | G06F 1/1601 |
| | | | | 361/679.21 |
| 8,670,230 B2* | 3/2014 | Cheng | ............... | F16M 13/00 |
| | | | | 361/679.41 |
| 8,688,037 B2* | 4/2014 | Chatterjee | ............... | G06F 1/1632 |
| | | | | 455/41.1 |
| 8,913,380 B2* | 12/2014 | Enomoto | ............... | G06F 1/1632 |
| | | | | 361/679.41 |
| 9,204,697 B2 | 12/2015 | Yang | | |
| 9,253,295 B2 | 2/2016 | Samsilova | | |
| 9,264,088 B2 | 2/2016 | Wojcik et al. | | |
| 9,310,840 B2* | 4/2016 | Beatty | ............... | F16M 13/00 |
| 9,436,226 B2* | 9/2016 | Chen | ............... | G06F 1/1628 |
| 9,600,031 B2* | 3/2017 | Kaneko | ............... | E05C 19/10 |
| 10,013,019 B2* | 7/2018 | Juan | ............... | G06F 1/181 |
| 10,037,055 B2* | 7/2018 | Kaneko | ............... | G06F 3/041 |
| 10,192,665 B2* | 1/2019 | Breiwa | ............... | H02J 50/10 |
| 10,738,508 B2* | 8/2020 | Moock | ............... | E05B 47/0012 |
| 10,754,381 B2* | 8/2020 | Schatz | ............... | G06F 1/1683 |
| 2012/0267491 A1* | 10/2012 | Chiu | ............... | F16M 13/00 |
| | | | | 248/221.11 |
| 2013/0283867 A1 | 10/2013 | Fontana et al. | | |
| 2013/0303000 A1 | 11/2013 | Witter et al. | | |
| 2014/0362517 A1* | 12/2014 | Moock | ............... | E05B 47/0012 |
| | | | | 361/679.43 |
| 2016/0132852 A1* | 5/2016 | Edwards | ............... | G06Q 20/204 |
| | | | | 705/17 |
| 2016/0231778 A1* | 8/2016 | Kaneko | ............... | G06F 1/1632 |
| 2016/0253649 A1* | 9/2016 | Govindarajan | ............... | G06F 1/1633 |
| | | | | 705/17 |
| 2016/0259374 A1 | 9/2016 | Breiwa et al. | | |
| 2017/0107742 A1* | 4/2017 | Moock | ............... | E05B 73/0082 |
| 2017/0161708 A1* | 6/2017 | Edwards | ............... | G06Q 20/204 |
| 2018/0032104 A1* | 2/2018 | Schatz | ............... | G06F 1/1683 |
| 2018/0060851 A1* | 3/2018 | Govindarajan | ............... | G07G 1/12 |
| 2018/0258669 A1* | 9/2018 | Moock | ............... | E05B 73/0082 |
| 2019/0303906 A1* | 10/2019 | Govindarajan | ............... | G07G 5/00 |
| 2020/0347648 A1* | 11/2020 | Moock | ............... | G08B 13/06 |

* cited by examiner

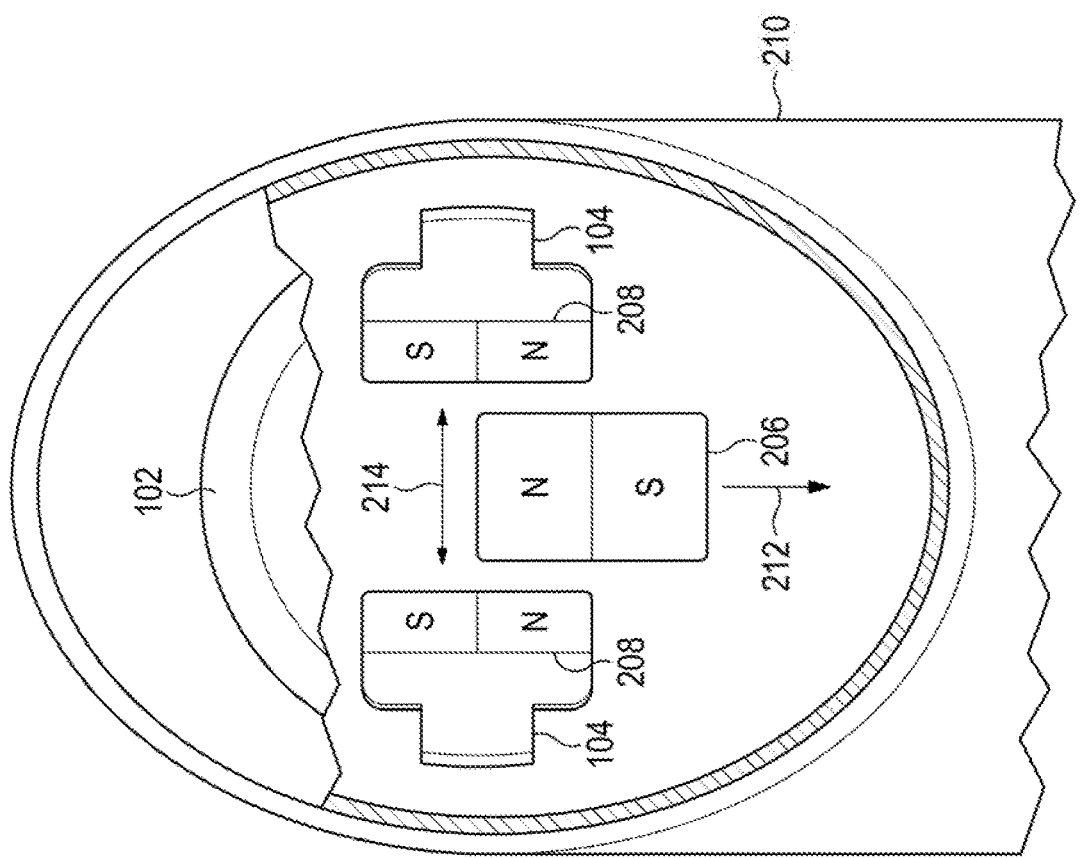
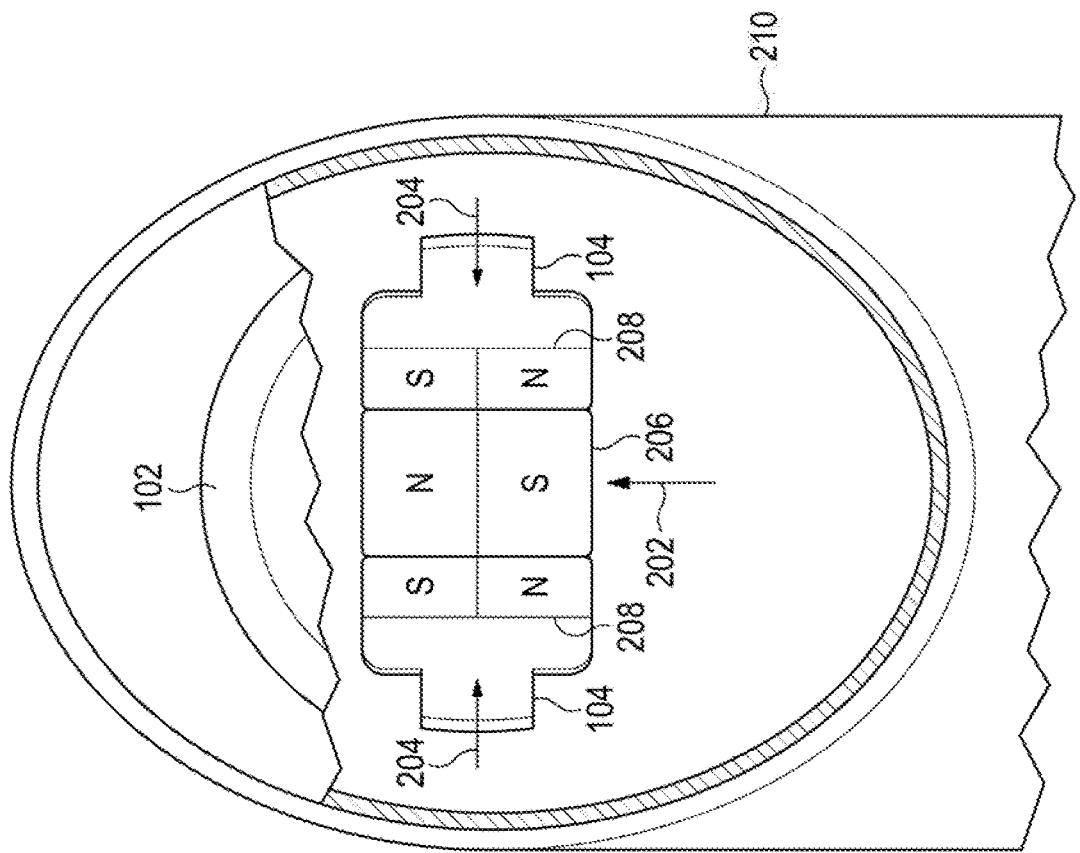

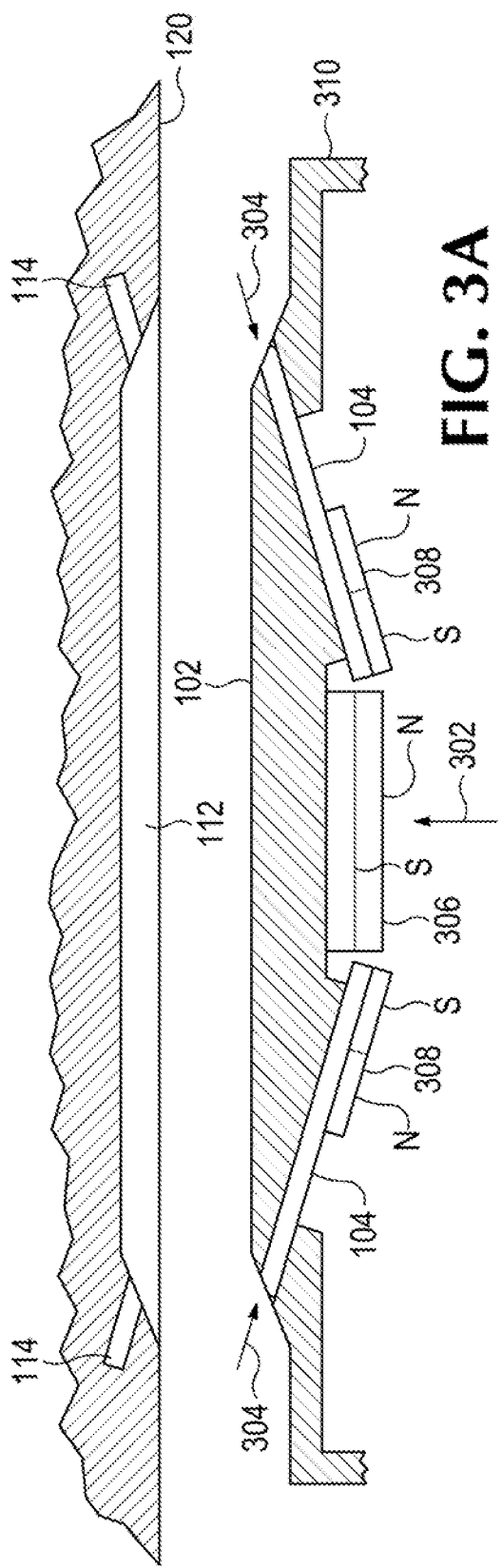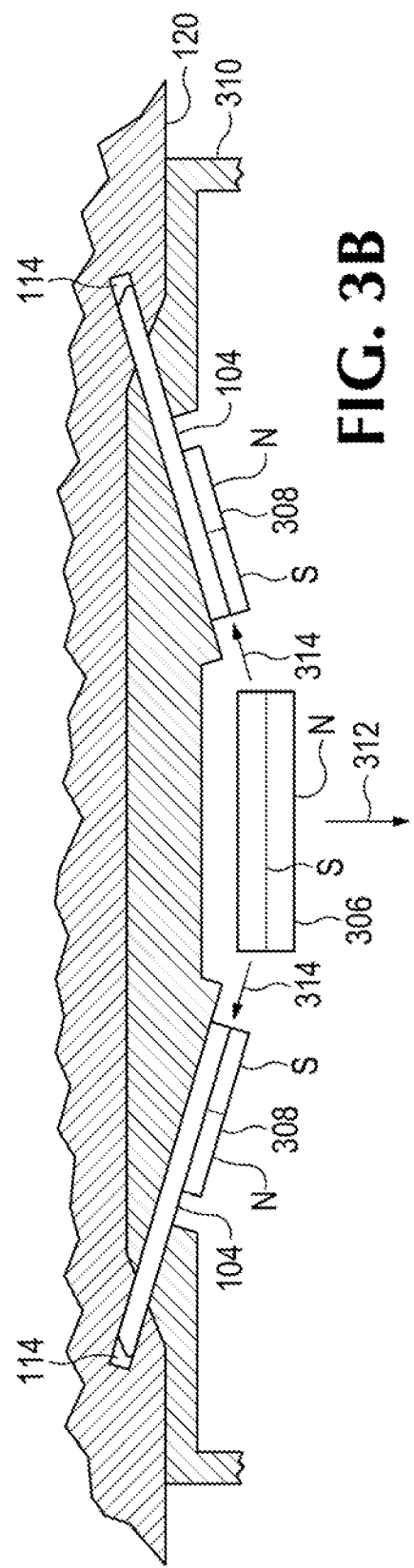

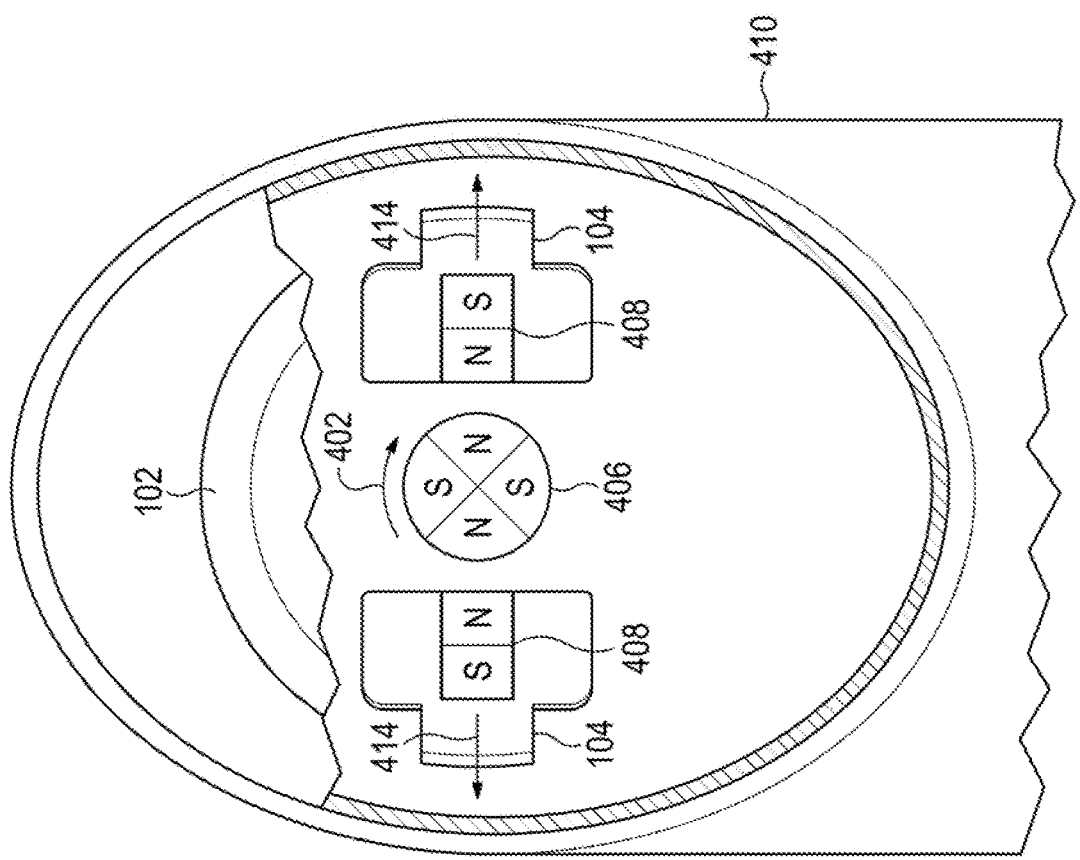
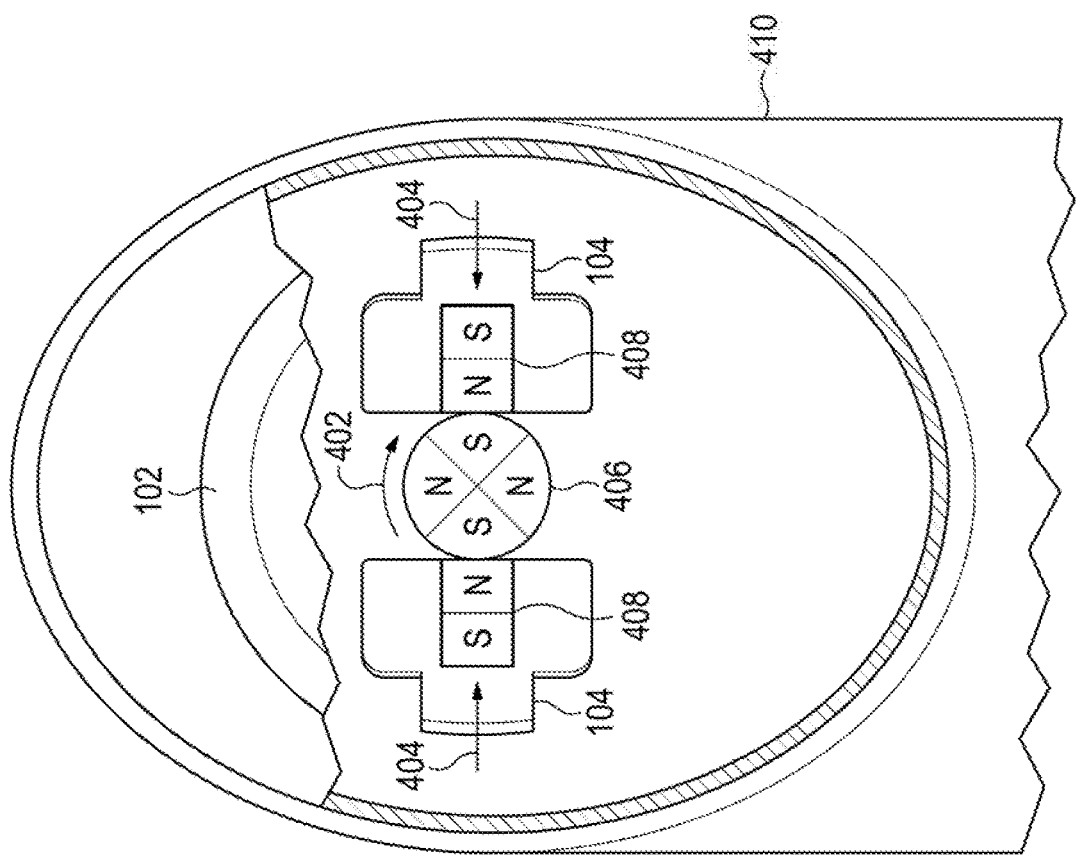

MAGNETIC MEMBERS OF DOCKING DEVICES

BACKGROUND

Point-of-sale terminals are often fixed installation units. Recent developments have resulted in removable display terminals that may be used by a salesperson to keep inventory, register sales, and the like, while carried around a retail or storage establishment. The system may then be brought back to a central location and docked. However, docking solutions may make using a portable display terminal awkward and detract from the aesthetics of the unit.

BRIEF DESCRIPTION OF THE DRAWINGS

FIGS. 2A-B illustrate a top view of a docking device, according to an example;

FIGS. 3A-B illustrate a cross-section of a docking device, according to an example; and FIGS. 4A-B illustrate a top view of a docking device, according to an example.

DETAILED DESCRIPTION

Examples disclosed herein provide a system including a docking device and computing device, such as a tablet computer of a point-of-sale terminal, which allows the use of an unobtrusive lock mechanism for mounting the computing device to the docking device. The docking device uses locking blades that, for example, travel along a 3-dimensional (3D) path to engage the computing device with the docking device, without interfering with the internal components of the computing device. As used herein, a 3D motion may include both a motion along an x-axis, for example, parallel to the face of a mounting device of the docking device, as well as motion along a z-axis, for example, perpendicular to the face of the mounting device. In one example, the vectors of the x-axis motion and the z-axis motion combine to give the locking blades an angular motion outwards from the face of the mounting device. As will be further described, movement of the locking blades may be controlled using magnetic members.

Figure 1A:
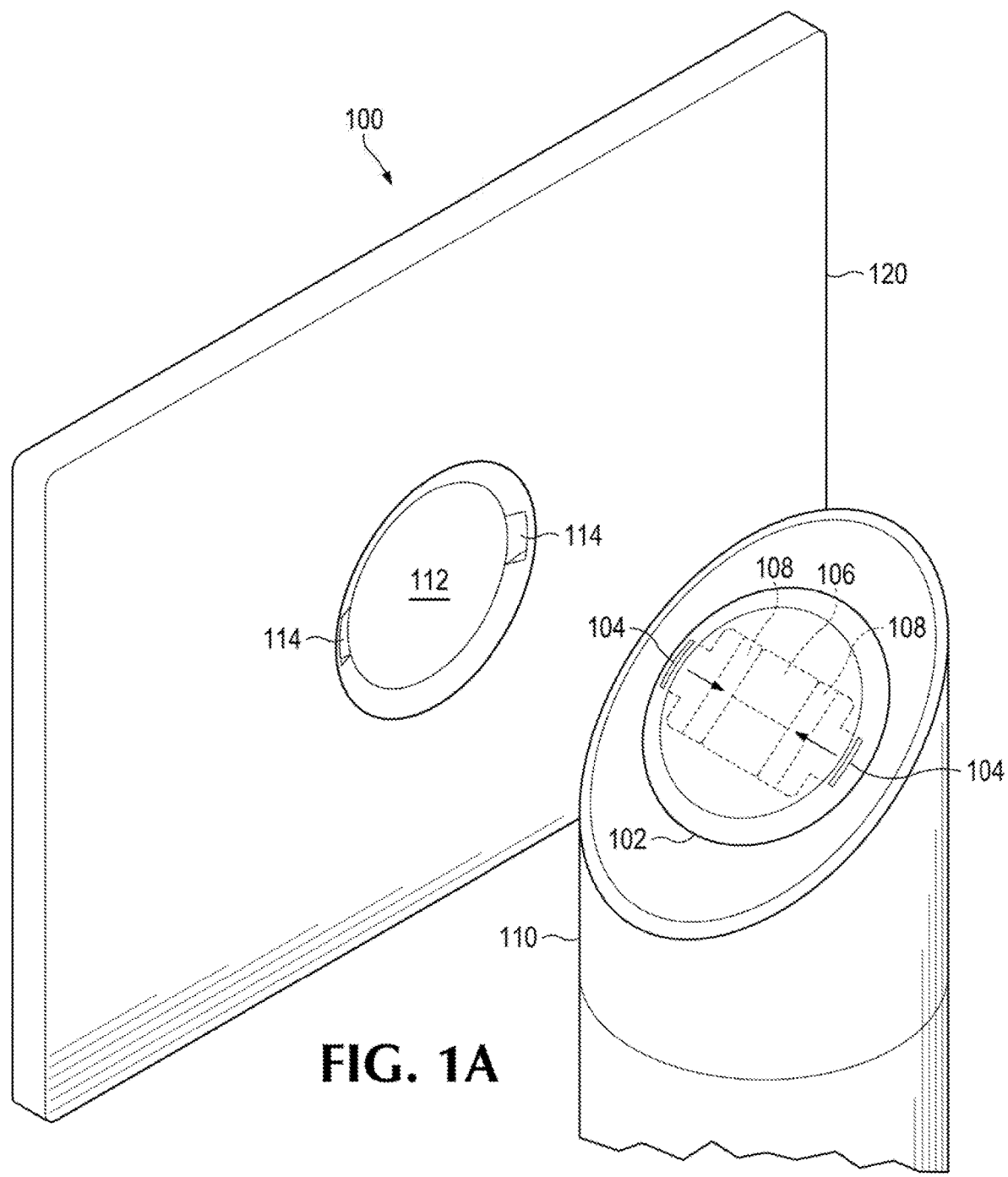
FIGS. 1A-B illustrate a system including a docking device and a computing device, according to an example.
Figure 1B:
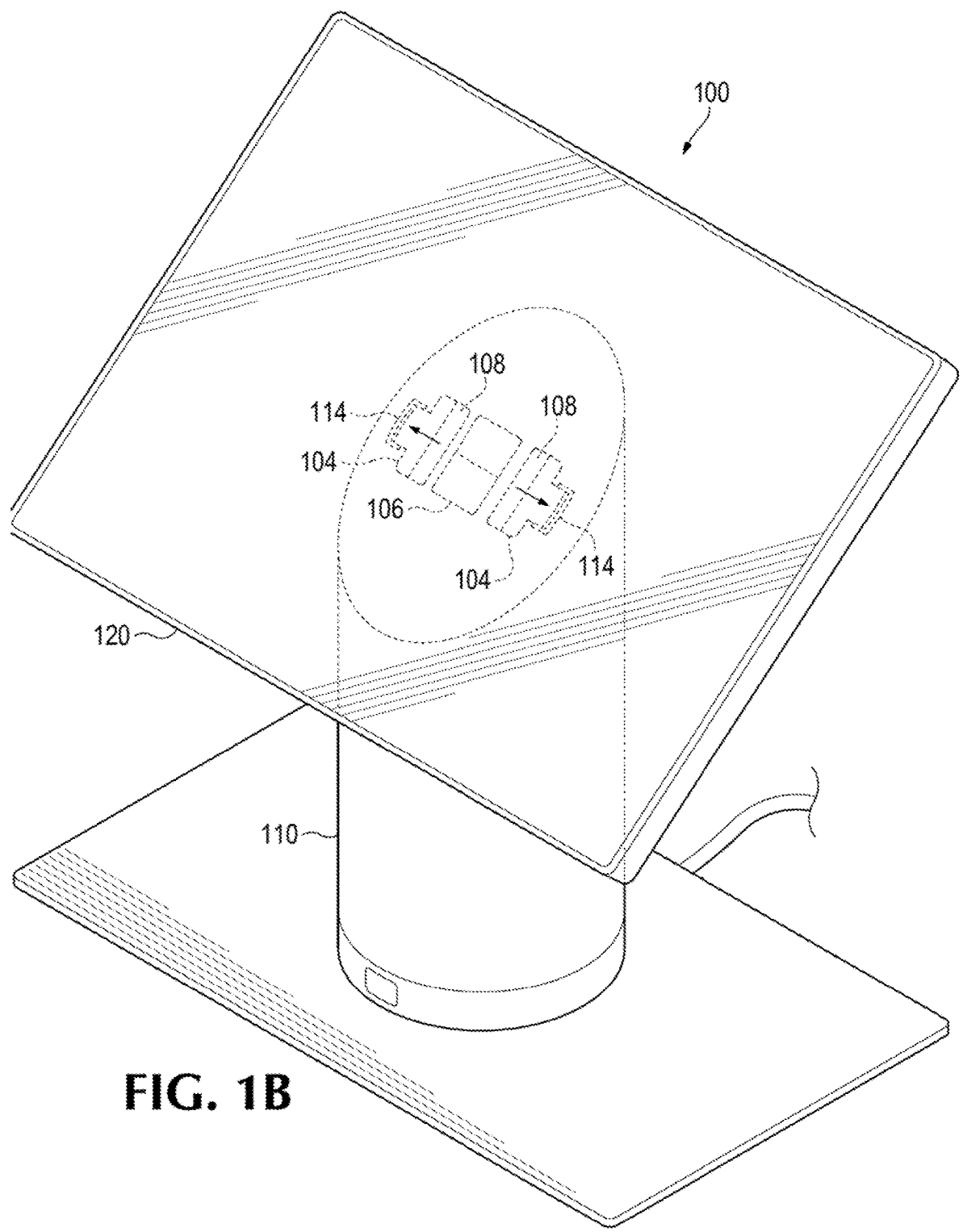

With reference to the figures, FIGS. 1A-B illustrate a system 100 including a docking device 110 and a computing device 120, according to an example. As illustrated, the docking device 110 includes a mounting device 102 to align with a mating cavity 112 of the computing device 120. While coupling the computing device 120 to the docking device 110, locking blades 104 may extend from the mounting device 102 into slots 114 in the mating cavity 112 of the computing device 120. Although two locking blades 104 (and corresponding slots 114) are illustrated, the number of locking blades may vary.

As an example, the mounting device 102 is minimal and unobtrusive. For example, when the computing device 120 is not mounted, as illustrated in FIG. 1A, the visible components of the mounting device 102 may include an angled plateau that resembles a male plug, and ends of the locking blades 104. On the computing device 120, the visible component may include the mating cavity 112, a complimentary female recess to the male plug of the mounting device 102, including the slots 114 into which the locking blades 104 slide. As an example, both the male plug and the female recess are circular, and the walls of the plug and recess are angled. As a result, a user may be able to more easily find the correct position of the computing device 120 on the docking device 110, as well as providing a larger area for the locking blades 104 to join the computing device 120 and docking device 110 together.

As an example, magnetic members may initiate extension and retraction of the locking blades 104 from the mounting device 102 into and out of the slots 114 in the mating cavity 112 of the computing device 120. As illustrated, a first magnetic member 106 disposed within the mounting device 102 may be used to initiate the extension and retraction of the locking blades 104. As an example, the locking blades 104 include second magnetic members 108 to interact with the first magnetic member 106. As will be further described, this interaction between the first and second magnetic members 106, 108 may initiate the extension and retraction of the locking blades 104.

As an example, the magnetic polarities of the magnetic members 106, 108 with respect to each other determines the force generated between them, that will then initiate either the extension or retraction of the locking blades 104. For example, when the magnetic members 106, 108 have the same polarity (e.g., N-N or S-S), a negative or repulsive magnetic force may be generated, whereas when the magnetic members 106, 108 have opposite polarities (e.g., N-S), a positive or attractive magnetic force is generated. In addition to magnetic polarity, the field strength of the magnetic members 106, 108 may be controlled to determine the magnitude of the magnetic force generated based on the magnetic polarities of the magnetic members 106, 108 with respect to each other.

Referring to FIG. 1A, when the first and second magnetic members 106, 108 are to have opposite polarities, a resulting attractive magnetic force is generated (indicated by arrows). This positive or attractive magnetic force is to retract the locking blades 104 out of the slots 114 in the mating cavity 112, to undock the computing device 120 from the docking device 110. With the positive or attracting magnetic force retracting the locking blades 104 back into the mounting device 102, the locking blades 104 are out of the way while they are not in use.

Referring to FIG. 1B, when the first and second magnetic members 106, 108 are to have a same magnetic polarity, a resulting repulsive force is generated (indicated by arrows). This negative or repulsive magnetic force is to extend the locking blades 104 from the mounting device 102 into the slots 114 in the mating cavity 112, to dock and secure the computing device 120 to the docking device 110. As will be further described, the magnetic polarities between the first and second magnetic members 106, 108 may be adjusted to initiate the extension or retraction of the locking blades 104. This adjustment in magnetic polarities may be manual or automated.

FIGS. 2A-B illustrate a top view of a docking device 210, according to an example. The docking device 210 represents an example of the docking device 110 described above. To make clear the use of magnetic members to initiate the extension and retraction of locking blades 104, a mounting device of the docking device 210 is removed, to expose internal components of the docking device 210. As an example, an interaction between a first magnetic member 206 and second magnetic members 208 of the locking blades 104 initiates the extension and retraction of the locking blades 104.

Referring to FIG. 2A, when the first magnetic member 206 is slid to a first position, indicated by arrow 202, the first and second magnetic members 206, 208 are to have opposite magnetic polarities with respect to each other. For example, the north end of the first magnetic member 206 is opposite from the south end of second magnetic members 208. Similarly, the south end of the first magnetic member 206 is opposite from the north end of second magnetic members 208. As a result, an attractive magnetic force is generated and a retraction of the locking blades 104 are initiated, as illustrated by arrows 204. As an example, the first magnetic member 206 may be moved manually or automatically, for example, by a motor or solenoid.

Referring to FIG. 2B, when the first magnetic member 206 is slid to a second position, indicated by arrow 212, the first and second magnetic members 206, 208 are to have a same magnetic polarity with respect to each other. As mentioned above, the first magnetic member 206 may be moved manually or automatically, for example, by a motor or solenoid. In addition, rather than being moved downward to the second position illustrated in FIG. 2B, the first magnetic member 206 may also be moved upward. Referring to the position illustrated in FIG. 2B, the north end of the first magnetic member 206 is opposite from the north end of second magnetic members 208. As a result, a repulsive magnetic force is generated and extension of the locking blades 104 are initiated, as illustrated by double-sided arrow 214. By relying on the arrangement of the first and second magnetic members 206, 208 with respect to each other, the number of internal components in the docking device 210 for initiating the extension and retraction of the locking blades 104 may be kept to a minimum.

FIGS. 3A-B illustrate a cross-section of a docking device 310 that the computing device 120 may dock to, according to an example. The docking device 310 represents an example of the docking device 110 described above. The cross-section of the docking device 310 makes clear the use of magnetic members to initiate the extension and retraction of locking blades 104. As an example, an interaction between a first magnetic member 306 and second magnetic members 308 of the locking blades 104 initiates the extension and retraction of the locking blades 104.

Referring to FIG. 3A, when the first magnetic member 306 is slid to a first position, indicated by arrow 302, the first and second magnetic members 306, 308 are to have opposite magnetic polarities with respect to each other. For example, the north end of the first magnetic member 306 is opposite from the south end of second magnetic members 308. As a result, an attractive magnetic force is generated and a retraction of the locking blades 104 are initiated, as illustrated by arrows 304. As an example, the first magnetic member 306 may be moved manually or automatically, for example, by a motor or solenoid.

Referring to FIG. 3B, when the first magnetic member 306 is slid to a second position, indicated by arrow 312, the first and second magnetic members 306, 308 are to have a same magnetic polarity with respect to each other. As mentioned above, the first magnetic member 306 may be moved manually or automatically, for example, by a motor or solenoid. Referring to the position illustrated in FIG. 3B, the south end of the first magnetic member 306 is opposite from the south end of second magnetic members 408. As a result, a repulsive magnetic force is generated and extension of the locking blades 104 are initiated, as illustrated by arrows 314. This magnetic force may then dock the computing device 120 to the docking device 310, upon the locking blades 104 entering the mating cavities 114. By relying on the arrangement of the first and second magnetic members 306, 308 with respect to each other, the number of internal components in the docking device 310 for initiating the extension and retraction of the locking blades 104 may be kept to a minimum.

FIGS. 4A-B illustrate a top view of a docking device 410, according to an example. The docking device 410 represents an example of the docking device 110 described above. To make clear the use of magnetic members to initiate the extension and retraction of locking blades 104, a mounting device of the docking device 410 is removed, to expose internal components of the docking device 410. As an example, an interaction between a first magnetic member 406 and second magnetic members 408 of the locking blades 104 initiates the extension and retraction of the locking blades 104. As illustrated, the first magnetic member 406 is circular and diametrically magnetized. The number of sections of the first magnetic member 406 that is diametrically magnetized may be based on the number of locking blades 104. For example, with two locking blades 104, as illustrated, the first magnetic member 406 may be diametrically magnetized into four quadrants. However, if a docking device has only one locking blade, the first magnetic member may be diametrically magnetized into two semicircles.

Referring to FIG. 4A, when the first magnetic member 406 is rotated (indicated by arrow 402) a quarter turn (e.g., 45 degrees) to a first position, the first and second magnetic members 406, 408 are to have opposite magnetic polarities with respect to each other. For example, the quadrants of the first magnetic member 406 having a south pole are opposite from the north end of second magnetic members 408. As a result, an attractive magnetic force is generated and a retraction of the locking blades 104 are initiated, as illustrated by arrows 404. As an example, the first magnetic member 406 may be moved manually or automatically, for example, by a servo motor.

Referring to FIG. 4B, when the first magnetic member 406 is rotated another quarter turn to a second position, the first and second magnetic members 406, 408 are to have a same magnetic polarity with respect to each other. Rather than being rotated clockwise to the second position illustrated in FIG. 4B, the first magnetic member 406 may also be rotated counterclockwise. Referring to the position illustrated in FIG. 4B, the quadrants of the first magnetic member 406 having a north pole are opposite from the north end of second magnetic members 408. As a result, a repulsive magnetic force is generated and extension of the locking blades 104 are initiated, as illustrated by arrows 414. By relying on the arrangement of the first and second magnetic members 406, 408 with respect to each other, the number of internal components in the docking device 410 for initiating the extension and retraction of the locking blades 104 may be kept to a minimum.

It should be understood that examples described herein below may include various components and features. It should also be understood that, in the following description, numerous specific details are set forth to provide a thorough understanding of the examples. However, it should be understood that the examples may be practiced without limitations to these specific details. In some instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples. The various instances of the phrase "in one example" or similar phrases in various places in the specification are not necessarily all referring to the same example.

It should be understood that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A system comprising a docking device and a computing device, wherein the docking device comprises:
    a mounting device to align with a mating cavity of the computing device;
    a locking blade that extends from the mounting device into a slot in the mating cavity of the computing device; and
    a first magnetic member disposed within the mounting device, wherein the first magnetic member is to initiate extension and retraction of the locking blade from the mounting device into and out of the slot in the mating cavity.

2. The system of claim 1, wherein the locking blade comprises a second magnetic member to interact with the first magnetic member, wherein the interaction between the first and second magnetic members is to initiate the extension and retraction of the locking blade.

3. The system of claim 2, wherein when the first and second magnetic members are to have a same magnetic polarity, a resulting repulsive magnetic force is to extend the locking blade from the mounting device into the slot in the mating cavity of the computing device.

4. The system of claim 2, wherein when the first and second magnetic members are to have opposite magnetic polarities, a resulting attractive magnetic force is to retract the locking blade out of the slot in the mating cavity of the computing device.

5. The system of claim 2, wherein the interaction between the first and second magnetic members comprises sliding the first magnetic member with respect to the second member, wherein sliding the first magnetic member to a first position is to initiate the retraction of the locking blade, and wherein sliding the first magnetic member to a second position is to initiate the extension of the locking blade.

6. The system of claim 5, wherein when the first magnetic member is to be slid to the first position, the first and second magnetic members are to have opposite magnetic polarities, wherein an attractive magnetic force is generated.

7. The system of claim 5, wherein when the first magnetic member is to be slid to the second position, the first and second magnetic members are to have a same magnetic polarity, wherein a repulsive magnetic force is generated.

8. The system of claim 2, wherein the first magnetic member is circular and diametrically magnetized.

9. The system of claim 8, wherein the interaction between the first and second magnetic members comprises rotating the first magnetic member, wherein rotating the first magnetic member to a first position is to initiate the retraction of the locking blade, and wherein rotating the first magnetic member to a second position is to initiate the extension of the locking blade.

10. A docking device for a computing device, the docking device comprising:
    a mounting device to align with a mating cavity of the computing device, the mounting device comprising a first magnetic member disposed within the mounting device; and
    a locking blade that extends from the mounting device into a slot in the mating cavity of the computing device, the locking blade comprising:
        a second magnetic member to interact with the first magnetic member, wherein the interaction between the first and second magnetic members is to initiate extension and retraction of the locking blade from the mounting device into and out of the slot in the mating cavity.

11. The docking device of claim 10, wherein when the first and second magnetic members are to have a same magnetic polarity, a resulting repulsive magnetic force is to extend the locking blade from the mounting device into the slot in the mating cavity of the computing device.

12. The docking device of claim 10, wherein when the first and second magnetic members are to have opposite magnetic polarities, a resulting attractive magnetic force is to retract the locking blade out of the slot in the mating cavity of the computing device.

13. The docking device of claim 10, wherein the interaction between the first and second magnetic members comprises sliding the first magnetic member with respect to the second member, wherein sliding the first magnetic member to a first position is to initiate the retraction of the locking blade, and wherein sliding the first magnetic member to a second position is to initiate the extension of the locking blade.

14. The docking device of claim 10, wherein the first magnetic member is circular and diametrically magnetized.

15. The docking device of claim 14, wherein the interaction between the first and second magnetic members comprises rotating the first magnetic member, wherein rotating the first magnetic member to a first position is to initiate the retraction of the locking blade, and wherein rotating the first magnetic member to a second position is to initiate the extension of the locking blade.

* * * * *